(12) United States Patent
Ashkenazi

(10) Patent No.: US 8,470,721 B2
(45) Date of Patent: Jun. 25, 2013

(54) MAGNETIC PROCESSING OF OPERATING ELECTRONIC MATERIALS

(76) Inventor: Brian I. Ashkenazi, Los Angeles, CA (US)

( * ) Notice: Subject to any disclaimer, the term of this patent is extended or adjusted under 35 U.S.C. 154(b) by 572 days.

(21) Appl. No.: 12/653,714

(22) Filed: Dec. 17, 2009

(65) Prior Publication Data
US 2010/0151697 A1    Jun. 17, 2010

Related U.S. Application Data

(62) Division of application No. 11/136,808, filed on May 24, 2005, now Pat. No. 7,713,888.

(51) Int. Cl.
*H01L 21/00* (2006.01)

(52) U.S. Cl.
USPC ............. 438/800; 257/E21.347; 257/E21.327

(58) Field of Classification Search
USPC .................... 438/800; 257/E21.347, E21.327
See application file for complete search history.

(56) References Cited

U.S. PATENT DOCUMENTS

| | | | | | |
|---|---|---|---|---|---|
| 3,703,958 | A | * | 11/1972 | Kolm | 210/695 |
| 4,816,965 | A | * | 3/1989 | Drits | 361/267 |
| 5,885,370 | A | * | 3/1999 | Shimotomai et al. | 148/108 |
| 5,935,346 | A | * | 8/1999 | Couderchon et al. | 148/108 |
| 6,144,544 | A | * | 11/2000 | Milov et al. | 361/143 |
| 7,161,124 | B2 | * | 1/2007 | Kisner et al. | 219/635 |

* cited by examiner

*Primary Examiner* — Steven J Fulk

(57) ABSTRACT

The electronic properties (such as electron mobility, resistivity, etc.) of an electronic material in operation in an electronic device or electronic circuit can be modified/enhanced when subjected to dynamic or stationary magnetic fields with current flowing through the electronic material. Heating or cooling of the electronic material further enhances the electronic properties.

8 Claims, 4 Drawing Sheets

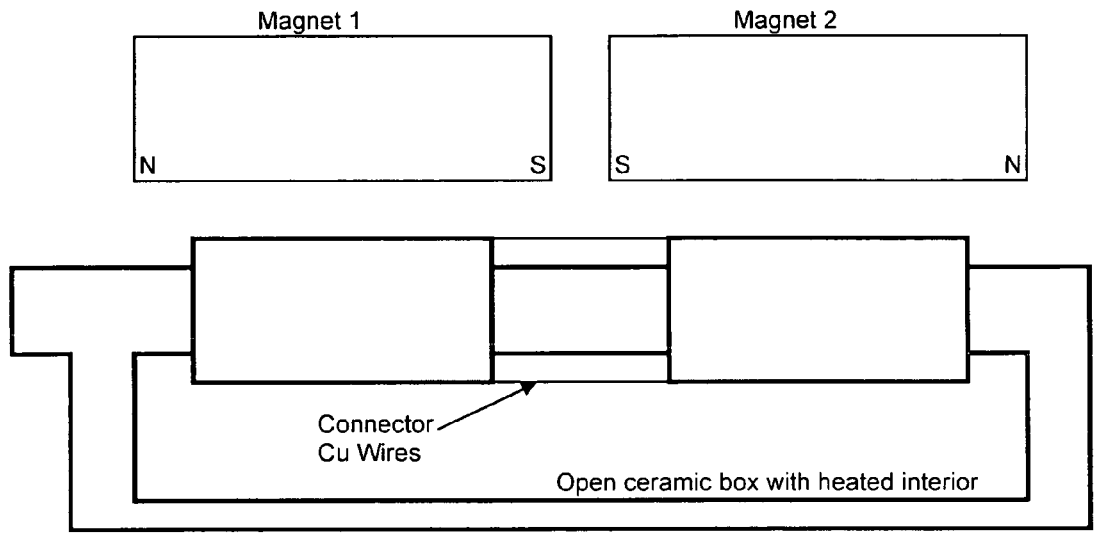
Fig. 1
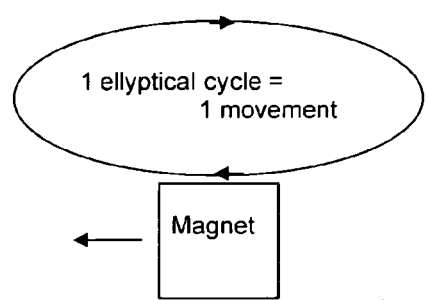
Fig. 2
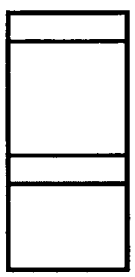

Fig. 8B  Fig. 8C

MAGNETIC PROCESSING OF OPERATING ELECTRONIC MATERIALS

CROSS REFERENCE TO RELATED APPLICATION

This application is a divisional application for patent application Ser. No. 11/136,808 filed on May 24, 2005 now U.S. Pat. No. 7,713,888.

BACKGROUND

SUMMARY

The electronic properties (such as electron mobility, resistivity, etc.) of an electronic material can be modified/enhanced when subjected to dynamic or stationary magnetic fields in conjunction with heating, cooling and passage of electric current through the material while in operation in an electronic device or electronic circuit.

BRIEF DESCRIPTION OF THE DRAWINGS

The features, aspects, and advantages of the invention will become more thoroughly apparent from the following detailed description, appended claims, and accompanying drawings in which:

FIG. 1 illustrates a layout of an n-type/p-type thermoelectric generator with two magnets.

FIG. 2 illustrates a magnet "movement" for processing an electronic material.

FIGS. 8A-8C illustrate processing of a rod-shaped workpiece.

DETAILED DESCRIPTION

Figure 3:
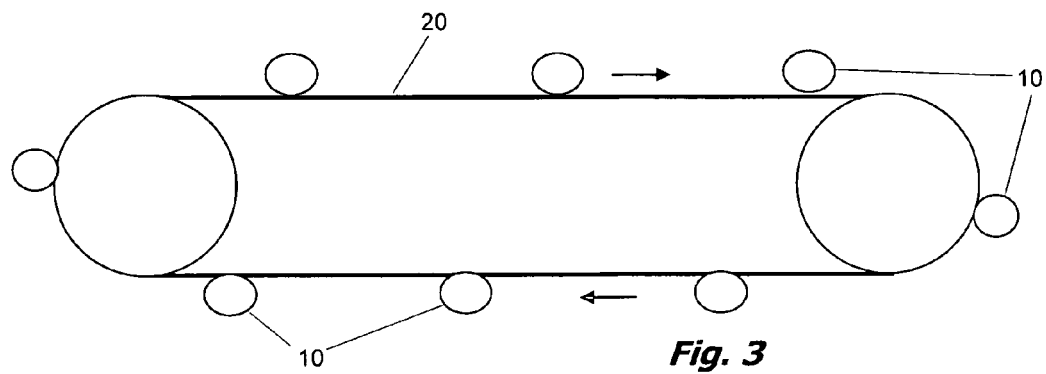
FIG. 3 is a simplified side view of a "magnetic belt" for processing an electronic material.

Electronic materials have so far been assigned typical physical output values that have been determined by testing. Most of these test values have been taken in a standard ambient environment and, to date, the effects of subjecting the materials to other enhancing environments have not been studied. This invention relates to techniques for enhancing the performance of electronic materials by subjecting them to magnetic fields.

The electronic properties (such as electron mobility, resistivity, etc.) of an electronic material can be modified/enhanced when subjected to dynamic or stationary magnetic fields in conjunction with select cycles of heating, cooling and passage of electric current through the material. This "processing" includes one or more cycles using combinations of the aforementioned variables.

This process can be used in-situ with products such as photovoltaics, thermoelectric electric generation, thermoelectric cooling, detectors, transistors, etc. It could also be used to improve materiaUdevice performance prior to installation in electronic assemblies. Further, either the magnetic fields or the material/device (or both) could be dynamic. The magnetic field combinations that can be used are boundless. However, it should be noted that the magnetic fields used are directional and not oscillatory.

Preliminary testing of magnetic fields on electronic materials has been conducted as follows:

1) A thermoelectric generator was set up and heated to T1 in a closed environment (FIG. 1).
2) Airflow was introduced on the cool side of the generator to maximize the temperature difference and current. The heavy airflow also eliminated any cooling by below magnet movements.
3) After an hour of working the current flow had stabilized to a value of $I_0$.
4) Magnetic flux was applied, 50 elliptical "movements" (FIG. 2) at approximately 1 Hz, to both n and p parts of the thermoelectric generator; current value was recorded at $1.6 \times I_0$.
5) The thermoelectric generator was cooled down to room temperature.
6) The thermoelectric generator was reheated to T1 and allowed to stabilize with the same airflow for an hour; the new current was recorded at $1.25 \times I_0$.
7) A stationary magnetic field was applied to the TE generator and current was recorded at $1.4 \times I_0$.
8) The thermoelectric generator was cooled down to room temperature.
9) After cool down, reheating to T1, providing airflow and stabilizing, a magnetic flux was applied, 100 "movements" at approximately 1 Hz, to both n and p parts of the thermoelectric generator, current value was recorded at $1.95 \times I_0$.
10) After cool down, reheating to T1, providing airflow and stabilizing, the new current draw was recorded at $>1.3 \times I_0$.
11) A stationary magnetic field was applied to the TE generator and current was recorded at $\sim 1.5 \times I_0$.
12) Procedures 1-11 were repeated several times with the same outcome.

It should be noted that higher frequency (greater than the 1 Hz used in preliminary testing) and infinite/continuous movements (circular/elliptical/oscillated motion at the side of or around the electronic material) of the magnet(s) are each expected to have a positive impact on performance enhancement for electronic materials.

For the above-described preliminary testing, the following new physical effects were observed:

1) magnetic "quenching/tempering" of electronic materials, prior to their use, enhances the materials performance;
2) using a quenched electronic material with a magnetic field (in certain applications) further enhances performance of the material; and
3) applying magnetic flux to a working electronic material creates a pumping effect on the workings of the material which multiplies the output several times.

In summary, the magnetic quenching/tempering for each electronic material may include a specific process with controlled combinations of the following:

1) setup for electronic material
2) temperature
3) rate of heat up
4) magnetic field strength
5) magnetic flux/frequency (possibly determined by material's natural frequency)
6) movement of magnets
7) number of cycles used by magnets
8) time for magnetic flux application 9) rate of cool down 10) number of times above cycles 1 to 8 performed.

Thus, many ingots/rods of electronic materials could be magnetically quenched/tempered to inexpensively achieve much better output performance.

Figure 4:
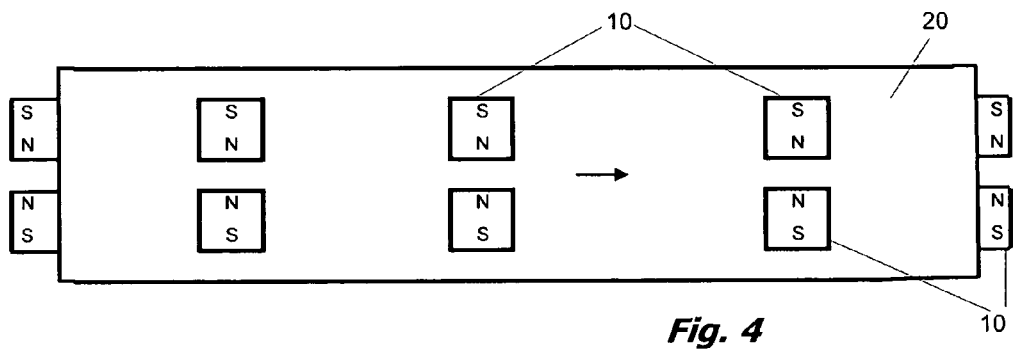
FIG. 4 is a simplified top plan view of the magnetic belt shown in FIG. 3.
Figure 5:
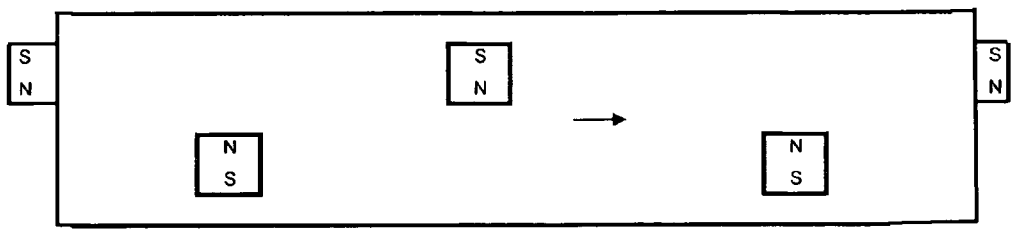
FIG. 5 is a simplified top plan view of an alternative arrangement of a magnetic belt.

Dynamic or "staggered" magnetic fields may be used to create a more powerful pumping action on the electronic material. The following testing performed by the inventor demonstrated that controlled magnetic flux can produce pumping action to increase the current flowing in an electronic material by varying the pattern and frequency of the magnetic flux applied to the electronic material:

1) A magnetically quenched (annealed) n-p thermoelectric module was set up and heated to temperature T1 in a closed environment.
2) Airflow was introduced on the cool side of the thermoelectric module to maximize the temperature difference and current. The airflow also eliminated any cooling by below magnet movements.
3) After the current flow had stabilized in the module, the current value was recorded at $I_A$.
4) Unidirectional dynamic magnetic flux was applied to both n and p parts of the annealed thermoelectric module using a "standard magnetic belt" (i.e., magnets 10 attached to a belt 20 as in FIG. 3) with a magnet pattern as shown in FIG. 4. The new current was recorded at $1.5 \times I_A$.
5) The same unidirectional dynamic magnetic flux was applied to only the n-part of the thermoelectric module. The new current value was recorded at approximately $1.1 \times I_A$.
6) The thermoelectric module was cooled to room temperature.
7) Next, after cool down, reheating to T1, providing airflow and stabilizing the annealed thermoelectric module, the stabilized current was recorded the same, i.e., $I_A$.
8) The same unidirectional dynamic magnetic flux was once again applied to both n and p parts of the annealed thermoelectric module using a different "staggered magnetic belt" with a pattern as shown in FIG. 5. The new current value was recorded at approximately $1.30 \times I_A$.

The following additional testing was also performed:

after cool down, reheating to T1, providing airflow and stabilizing the annealed thermoelectric module, the stabilized current was recorded at $I_A$.

unidirectional dynamic magnetic flux was applied to both n and p parts of the annealed thermoelectric module using " the standard magnetic belt". The current value was recorded at $1.15 \times I_A$.

the magnetic belt movement was then reversed and it was observed that the current dropped to zero. The current stayed at zero until the original "correct" magnetic belt movement was restored; the current then shot back at $1.15 \times I_A$.

The magnetic belt movement was once again reversed and it was observed once again that the current dropped to zero. This time the magnetic was then moved away from the thermoelectric module and it was observed the current stayed at zero for a long time before it very slowly began to creep upwards.

From the above testing, the following new additional physical effects were observed:

1) applying a directional staggered dynamic magnetic flux to the electronic material provides a pumping action to the charges in the current, similar to a paddle wheel on a river boat, that produces a turbocharged enhancement to the electronic material performance;
2) reversing the direction of the dynamic magnetic flu to an electronic material produces an abrupt, immediate braking action to performance of the material; this effect can be made to stay continuous or temporary;
3) applying magnetic flux to a working electronic material creates a pumping effect on the workings of the material which multiplies the output several times.

Figure 6B:
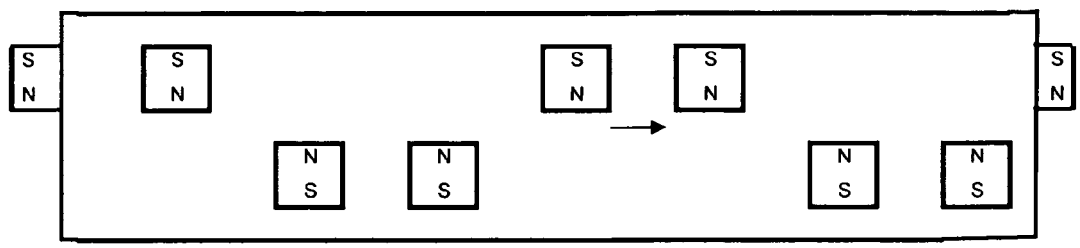
FIGS. 6A-6B are simplified top plan views of further alternative arrangements of a magnetic belt.
Figure 6A:
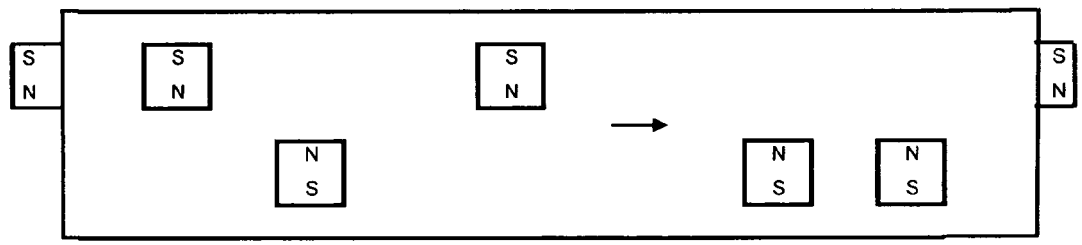

The following should be noted:

dynamic magnetic cycling can also be accomplished with the use of electromagnets, but theses are expensive and use a lot of electricity;

the above testing can be performed with many other magnet cycle combinations; a few are illustrated in FIGS. 6A and 6B;

to obtain optimum results for each specific application, polarity of each magnetic flux applied can be modified by design; and The magnetic belts may include a variety of designs, such as the magnets could be on the inside or outside of the belt, the belt is circulated around the electronic material, the belt is circulated between two electronic materials, etc.

Thus, the performance of many electronic products can be further improved during operation, beyond magnetic annealing, with the application of dynamic magnetic flux, standard or staggered. In addition, the new unique effect discovered (of immediate zero current with reverses dynamic magnetic flux) will provide many new, more reliable "braking" applications for electronic materials, such as precision brakes for automobiles, emergency shutdown for electronic equipment, etc.

Figure 7:
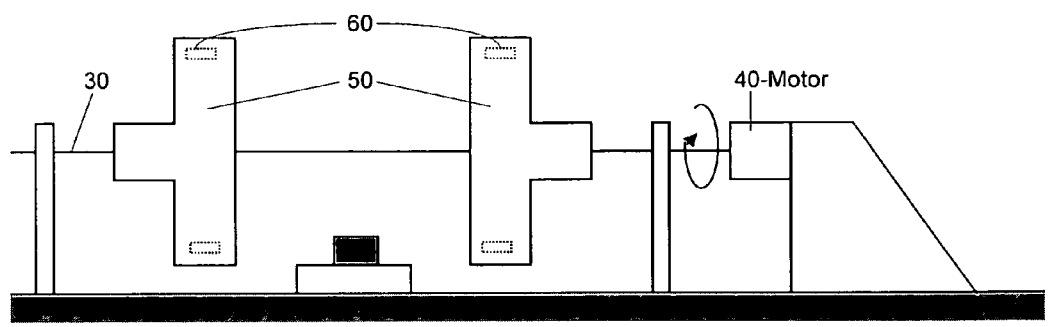
FIG. 7 illustrates a rotational processing configuration.

FIG. 7 illustrates a processing configuration comprising a drive shat 30 connected to a motor 40. The shaft is supported with two wheels 50 mounted on the shaft, each wheel loaded with several powerful rare-earth magnets 60 mounted around the circumference of each wheel. Most of the major components are of non-magnetic materials to avoid affecting the magnetic fields' performance.

An electronic workpiece is introduced in a mold (not depicted) between the wheels. The material is heated or cooled with optional electric current applied. The motor is turned on and the rotating magnets produce pulsed, directional dynamic magnetic fields on the workpiece.

As previously discussed, the frequency and configurations of the magnets used will depend on the material and electronic property selected for the modification/improvement.

Figure 8A:
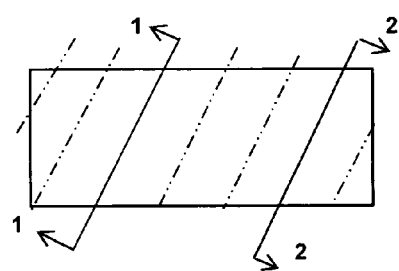
Figure 9:
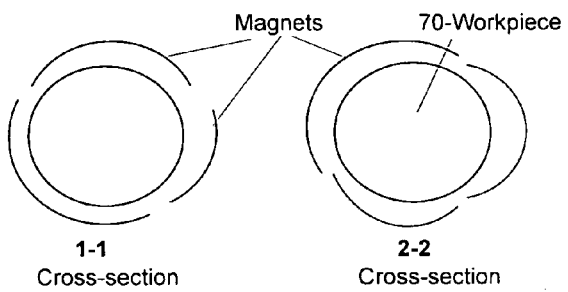
FIG. 9 illustrates processing of a plate-shaped workpiece.
Figure 9:
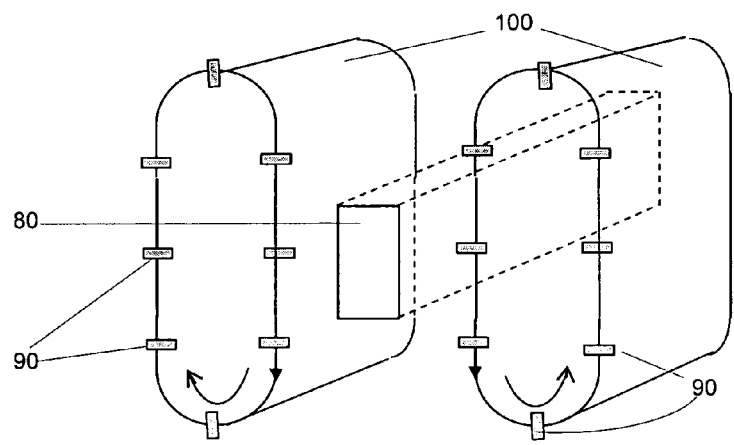

Note that this process is not restricted to small parts or devices, nor limited by the number of "wheels" or number/type/orientation of magnets used in the process. FIGS. 8 and 9 provide conceptual design of the means to perform similar applications to large workpieces.

FIG. 8 provides details of use with a large electronic rod 70. The magnets surround the workpiece and are attached to the inside of a cylinder. Successive magnet layers, along the workpiece, can be modified to produce turbulent magnetic actions on the workpiece. Either the cylinder with magnets or the workpiece may be rotated.

FIG. 9 provides another use for a flat sheet or plate 80. Magnets 90 are attached to belts 100 and the belts are cycled around the workpiece.

Processing in accordance with the present invention is not limited to semiconductor materials; it may also be used for so-called "standard" electronic materials, such as metallic wire, foil conductors, etc. For example, the application of dynamic magnetic fields in an electric motor or alternator/generator may be used to enhance output/performance.

In certain cases, it may be beneficial to skew the position of the magnets so that they are at an acute angle to either of the major axes (i.e., x-y-z) relative to the workpiece. The resulting "screw type" action (or paddle wheel effect) of the magnetic fields will further accelerate the moving charges, of the applied/existing current in the workpiece, along the length of the workpiece thereby enhancing the charge flow in the workpiece.

The invention claimed is:

1. A treatment process for modifying a respective electronic property internal to a prefabricated electronic material while in operation in an electronic device or electronic circuit, comprising: applying or generating an electric current through the electronic material; and applying a time-varying magnetic field relative to the electronic material; wherein the time-varying magnetic field has a unique and finite frequency range which is proportional to the natural frequency, or other comparable resonance or comparable frequency, of the electronic material; and wherein the time-varying magnetic field is one of a unidirectional, multidirectional field or staggered magnetic field, whereby the output of the electronic device or electronic circuit is a pumping-type output having a complex waveform.

2. The method of claim 1, further comprising heating the electronic material, whereby the respective electronic property of the electronic material is further enhanced.

3. The method of claim 1, further comprising cooling the electronic material, whereby the respective electronic property of the electronic material is further enhanced.

4. The method of claim 1, further comprising after applying the time-varying magnetic field is relative to the electronic material while in operation in the electronic device or electronic circuit, reversing the direction of the magnetic field whereby the output will instantaneously shut down.

5. The method of claim 1, wherein the time-varying magnetic field is generated by orbital motion of a magnet.

6. The method of claim 1, wherein the time-varying magnetic field is generated by dynamic magnetic flux equipment to produce high frequency.

7. The method of claim 1, whereby the respective property of the electronic material while in operation in an electronic device or electronic circuit is further enhanced by subjecting the material to one or more cycles of heating and cooling.

8. The method of claim 1, whereby the prefabricated electronic material is a hybrid design combination of metallic material and non-metallic electronic material.

\* \* \* \* \*